(12) United States Patent
Cheng et al.

(10) Patent No.: US 11,056,605 B2
(45) Date of Patent: Jul. 6, 2021

(54) DETECTION PANEL AND MANUFACTURING METHOD THEREOF

(71) Applicants: FUZHOU BOE OPTOELECTRONICS TECHNOLOGY CO., LTD., Fujian (CN); BOE TECHNOLOGY GROUP CO., LTD., Beijing (CN)

(72) Inventors: Hao Cheng, Beijing (CN); Yanfei Chi, Beijing (CN); Xinmao Qiu, Beijing (CN); Zihua Zhuang, Beijing (CN); Jin Wang, Beijing (CN); Changhong Shi, Beijing (CN); Min Zhou, Beijing (CN); Yaochao Lv, Beijing (CN); Yao Liu, Beijing (CN); Xi Chen, Beijing (CN)

(73) Assignees: FUZHOU BOE OPTOELECTRONICS TECHNOLOGY CO., LTD., Fuzhou (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/570,437

(22) Filed: Sep. 13, 2019

(65) Prior Publication Data

US 2020/0135957 A1 Apr. 30, 2020

(30) Foreign Application Priority Data

Oct. 31, 2018 (CN) .......................... 201811290845.3

(51) Int. Cl.
*H01L 31/108* (2006.01)
*H01L 27/146* (2006.01)
(Continued)

(52) U.S. Cl.
CPC ........ *H01L 31/1085* (2013.01); *G01T 1/2018* (2013.01); *H01L 27/14692* (2013.01); *G01T 1/003* (2013.01)

(58) Field of Classification Search
CPC ........... H01L 31/1085; H01L 27/14692; H01L 31/02327; H01L 27/14663;
(Continued)

(56) References Cited

U.S. PATENT DOCUMENTS 9,698,191 B2 7/2017 Hseih et al.
9,735,195 B2 8/2017 Shu et al.
(Continued)

FOREIGN PATENT DOCUMENTS

CN 102136519 A 7/2011
CN 104637970 A 5/2015
(Continued)

OTHER PUBLICATIONS

First Chinnese Office Action dated Mar. 3, 2020; Appln No. 201811290845.3.

*Primary Examiner* — Caleen O Sullivan

(57) ABSTRACT

A detection panel and a manufacturing method of the same are provided. The detection panel includes: a photosensitive element configured to sense a first light beam incident to the photosensitive element to generate a photosensitive signal; a drive circuit configured to be coupled to the photosensitive element to acquire the photosensitive signal from the photosensitive element, the drive circuit including a switch element; and a reflective grating which is on a side of the drive circuit where the first light beam is incident, and is configured to reflect at least a portion of the first light beam incident toward the switch element.

19 Claims, 4 Drawing Sheets

(51) Int. Cl.
*G01T 1/20* (2006.01)
*G01T 1/00* (2006.01)

(58) Field of Classification Search
CPC ......... H01L 27/14612; H01L 27/14629; H01L 27/14683; H01L 27/14685; G01T 1/2018; G01T 1/003
USPC ....................................................... 257/449
See application file for complete search history.

(56) References Cited

U.S. PATENT DOCUMENTS

| | | | |
|---|---|---|---|
| 9,755,090 B2 | 9/2017 | Portier et al. | |
| 9,876,125 B2 | 1/2018 | Natsuaki et al. | |
| 2016/0322516 A1* | 11/2016 | Portier | H01L 31/105 |

FOREIGN PATENT DOCUMENTS

| | | |
|---|---|---|
| CN | 105518875 A | 4/2016 |
| CN | 105981179 A | 9/2016 |
| CN | 107851653 A | 3/2018 |

\* cited by examiner

DETECTION PANEL AND MANUFACTURING METHOD THEREOF

This application claims the benefit of Chinese patent application No. 201811290845.3 filed on Oct. 31, 2018, which is hereby entirely incorporated by reference as a part of the present application.

TECHNICAL FIELD

Embodiments of the present disclosure relate to a detection panel and a manufacturing method of the detection panel.

BACKGROUND

In recent years, X-ray inspection has been widely used in various fields such as medical treatment, safety, non-destructive testing and scientific research. At present, the common X-ray detection technology is the X-ray digital radiography (DR) detection technology that appeared in the late 1990s. The X-ray digital radiography detection technology uses a flat panel detector (FPD) and has a pixel size of less than 0.1 mm, so the X-ray digital radiography detection technology has the image quality and resolution which are comparable to that of a film photography system, meanwhile overcomes shortcomings of the film photography system, and also provides convenience for computer processing of images.

SUMMARY

At least one embodiment of the present disclosure provides a detection panel which includes: a photosensitive element, configured to sense a first light beam incident to the photosensitive element to generate a photosensitive signal; a drive circuit, configured to be coupled to the photosensitive element to acquire the photosensitive signal from the photosensitive element, the drive circuit including a switch element; and a reflective grating, which is on a side of the drive circuit where the first light beam is incident, and is configured to reflect at least a portion of the first light beam incident toward the switch element.

In at least one example, the switch element includes a thin film transistor.

In at least one example, the detection panel further includes a base substrate, the photosensitive element, the drive circuit and the reflective grating are on the base substrate, and an orthographic projection of the reflective grating on the base substrate covers an orthographic projection of a channel region of the thin film transistor on the base substrate.

In at least one example, a material of the reflective grating is a metal material.

In at least one example, the reflective grating includes a sub-wavelength reflective grating.

In at least one example, the sub-wavelength reflective grating includes a base and grating ridges on the base, and the base has a refractive index lower than a refractive index of the grating ridges.

In at least one example, a material of the base is indium phosphide (InP) and a material of the grating ridges is indium gallium arsenide phosphide (InGaAsP).

In at least one example, the sub-wavelength reflective grating has a period ranging from 0.1 μm to 0.5 μm and a duty ratio ranging from 0.6 to 0.8.

In at least one example, the detection panel further includes a transmission grating, and the transmission grating is on a side of the photosensitive element where the first light beam is incident and is configured to transmit at least another portion of the first light beam incident toward the photosensitive element.

In at least one example, the detection panel further includes a base substrate, the photosensitive element, the drive circuit and the reflective grating are on the base substrate, and an orthographic projection of the transmission grating on the base substrate covers an orthographic projection of the photosensitive element on the base substrate.

In at least one example, the transmission grating includes a sub-wavelength anti-reflective grating.

In at least one example, the sub-wavelength anti-reflective grating has a thickness ranging from 80 nm to 150 nm.

In at least one example, the sub-wavelength anti-reflective grating has a duty ratio ranging from 0.15 to 0.5.

In at least one example, the reflective grating and the transmission grating are in a same layer and are of a same material.

In at least one example, the detection panel further includes a bias voltage line that is electrically connected with the photosensitive element to provide a bias voltage signal.

In at least one example, the bias voltage line, the reflective grating and the transmission grating are in a same layer and are of a same material.

In at least one example, the detection panel further includes a light conversion layer, the first light beam has a first wavelength, the light conversion layer is configured to convert a second light beam which is incident on the light conversion layer into the first light beam, and the second wavelength has a second wavelength smaller than the first wavelength.

In at least one example, the detection panel further includes a base substrate, the photosensitive element, the drive circuit and the reflective grating are on the base substrate, and the photosensitive element is on a side of the drive circuit away from the base substrate; the photosensitive element and the drive circuit are at least partially overlapped in a direction perpendicular to the base substrate.

In at least one example, the reflective grating is on a side of the photosensitive element close to the drive circuit.

In at least one example, the detection panel further includes a transmission grating, and the transmission grating is on a side of the photosensitive element where the first light beam is incident, and is configured to transmit the first light beam.

In at least one example, the detection panel further includes a bias voltage line that is electrically connected with the photosensitive element to provide a bias voltage signal.

In at least one example, the bias voltage line and the transmission grating are in the same layer and are of the same material.

At least one embodiment of the present disclosure also provides a manufacturing method of the detection panel, and the manufacturing method includes: forming a photosensitive element, so that the photosensitive element is configured to sense a first light beam incident to the photosensitive element to generate a photosensitive signal; forming a drive circuit, so that the drive circuit is configured to be coupled to the photosensitive element to acquire the photosensitive signal from the photosensitive element; and forming a reflective grating, so that the reflective grating is on a side of the drive circuit where the first light beam is incident, and is configured to reflect at least a portion of the first light beam incident toward the drive circuit.

In at least one example, the manufacturing method further includes forming a transmission grating on a side of the photosensitive element where the first light beam is incident, and the transmission grating is configured to transmit at least a portion of the first light beam incident toward the photosensitive element In at least one example, the reflective grating and the transmissive grating are formed in a same layer in a same patterning process.

In at least one example, the manufacturing method further includes forming a bias voltage line which is electrically connected with the photosensitive element to provide a bias voltage signal.

In at least one example, the reflective grating, the transmissive grating and the bias voltage line are formed in a same layer in a same patterning process.

In at least one example, the manufacturing method further includes providing a light conversion layer, the first light beam has a first wavelength, the light conversion layer is configured to convert an incident second light beam having a second wavelength to the first light beam, and the second wavelength is less than the first wavelength.

In at least one example, the manufacturing method further includes: forming a bias voltage line electrically connected with the photosensitive element to provide a bias voltage signal, and forming the reflective grating, the transmission grating and the bias voltage line in a same layer in a same patterning process.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
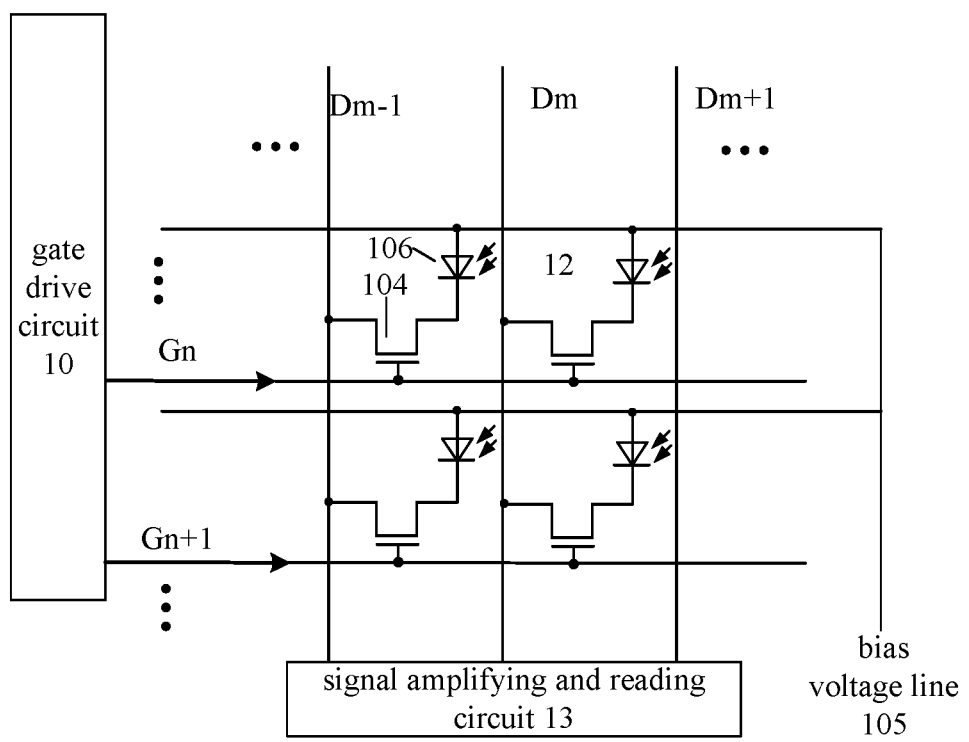
FIG. 1 is a schematic circuit diagram of a detection panel according to an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The disclosure is described below with reference to a few specific embodiments. In order to keep the following description of the embodiments of the present disclosure clear and concise, detailed descriptions of known functions and known components may be omitted. When any component of the embodiments of the present disclosure appears in more than one of the drawings, the component is denoted by the same reference numerals in the drawings.

FIG. 1 is a schematic circuit diagram of a detection panel according to an embodiment of the present disclosure. As shown in FIG. 1, the detection panel 100 includes a gate drive circuit 10, a signal amplifying and reading circuit 13, and a plurality of pixel units 12 arranged in an array. For example, in one example, each pixel unit 12 includes a photosensitive element 106 and a drive circuit 104 which is configured to drive the photosensitive element 106, and further includes a light conversion layer (not shown); for example, a material of the light conversion layer is a scintillator (cesium iodide) or a phosphor (gadolinium oxysulfide). For example, the drive circuit includes a switching transistor 104 and a storage capacitor (not shown), the switching transistor 104 is configured to be coupled to the photosensitive element 106, and to determine whether to read a photosensitive signal from the photosensitive element 106 based on a received control signal; the storage capacitor is configured to store the photosensitive signal generated by the photosensitive element 106. The switching transistor 104 is, for example, a field effect transistor, a thin film transistor, or the like.

As shown in FIG. 1, the photosensitive element 106 is, for example, a photodiode, and the storage capacitor may be provided by a reverse bias capacitor formed by an upper electrode and a lower electrode of the photosensitive element 106; alternatively, the storage capacitor may be separately provided. In another example, the photosensitive element 106 may be a metal-semiconductor-metal (MSM) type photosensitive element, in which case the storage capacitor may be separately provided to be in parallel connection or in series connection with the photosensitive element.

As shown in FIG. 1, the gate drive circuit 10 is connected with N rows of pixel units 12 in the array respectively through N gate lines, the signal amplifying and reading circuit 13 is connected with M columns of pixel units 12 in the array respectively through M data lines, and the N rows of pixel units 12 are also respectively connected with N bias voltage lines 105 to receive a bias voltage, where N and M are integers greater than one. As shown in FIG. 1, Gn denotes the gate line connected with the nth row of pixel units, Gn+1 denotes the gate line connected with the (n+1)th row of pixel units, Dm−1 denotes the data line connected with the (m−1)th column of pixel units, Din denotes the data line connected with the mth column of pixel units, and Dm+1 denotes the data line connected with the (m+1)th column of pixel units, where n and m are integers greater than one.

For example, in operation, the photodiode is in an off state under the bias voltage (reverse voltage) provided by the bias voltage line 105. In the situation where a second light beam having a second wavelength illuminates the detection panel, the light conversion layer converts the second light beam into a first light beam having a first wavelength, and the second wavelength is less than the first wavelength. For example, in the situation where the X-ray illuminates the array substrate, the light conversion layer converts the X-ray into visible light (for example, light having a wavelength ranging from 350 nm to 770 nm), and then the visible light is detected by the photosensitive element to generate a photosensitive signal; that is, the photosensitive element 106 senses the first light beam and generates a photosensitive signal, and the photosensitive signal is stored by the storage capacitor (i.e., the storage capacitor is charged or discharged). Then, under the action of gate scanning signals provided row by row by the gate drive circuit 10, the switching transistors 104 are turned on row by row, and electrical signals stored in the storage capacitors are transmitted to the signal amplifying and reading circuit 13 through the data lines. The amplifying and reading circuit 13 performs amplification, analog/digital conversion and the like on the electrical signals to obtain digital signals, and transmits the digital signals to an image processor system of a computer (for example, a central processor unit (CPU) or a graphics processor unit (GPU or the like) to form an X-ray image.

Figure 2:
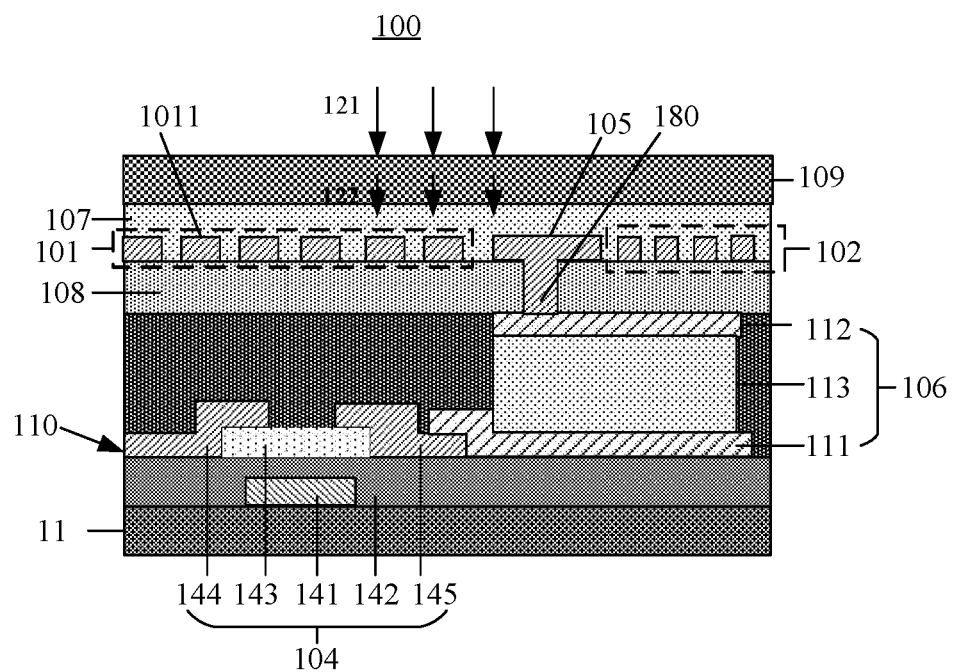
FIG. 2 is a schematic cross-sectional structural view of a detection panel according to an embodiment of the present disclosure.

FIG. 2 is a cross-sectional structural view of the detection panel according to an embodiment of the present disclosure, which shows a partial cross-sectional structure of one pixel unit of the detection panel 100. As shown in FIG. 2, the detection panel includes a base substrate 11, the drive circuit 110, the photosensitive element 106 and a reflective grating 101 which are formed on the base substrate 11. The drive circuit 110 is configured to be coupled to the photosensitive element 106 to receive the photosensitive signal generated from the photosensitive element 106; for example, the photosensitive element 106 may include a switch element which, for example, includes a switching transistor. For the sake of clarity, only the switching transistor 104 in the drive circuit is shown in the figure.

It should be noted that, in this context, "coupled" means that signal can be transmitted between the drive circuit 110 and the photosensitive element 106, including the case where the drive circuit 110 and the photosensitive element 106 are directly electrically connected with each other, and also includes other cases such as the case where the signal is transmitted between the drive circuit 110 and the photosensitive element 106 through, for example, capacitive coupling (e.g. a capacitor), which is not limited in the embodiments of the present disclosure.

For example, the detection panel further includes the light conversion layer 109. As shown in the figures, the light conversion layer 109 is disposed on a light incident side of the detection panel 100, and is configured to convert the incident second light beam 121 having the second wavelength into the first light beam 122 having the first wavelength, and the second wavelength is less than the first wavelength. For example, the second light beam 121 is an X-ray and the first light beam 122 is visible light. For example, the visible light has a wavelength in the range of 350 nm to 770 nm. For example, a wavelength of the visible light is around 550 nm. For example, the material of the light conversion layer 109 is a scintillator (cesium iodide) or a phosphor (gadolinium oxysulfide).

The photosensitive element 106 is configured to sense the first light beam 122 to generate the photosensitive signal. For example, as shown in the figures, the photosensitive element includes a first electrode 111, a second electrode 112, and a light detection layer 113 between the first electrode 111 and the second electrode 112. For example, the photosensitive element 106 is a photodiode such as a PN type photodiode, a PIN type photodiode or the like. The light detection layer 113 includes, for example, a PN junction composed of a p-type semiconductor layer and an n-type semiconductor layer, or a PIN junction composed of a p-type semiconductor layer, an intrinsic (i-type) semiconductor layer an n-type semiconductor layer. In another example, the photosensitive element 206 is a metal-semiconductor-metal (MSM) type photosensitive element, for example, the light detection layer 213 includes at least one selected from the group consisting of indium gallium arsenide phosphide (InGaAs), amorphous silicon, molybdenum sulfide, indium gallium zinc oxide, polycrystalline silicon, amorphous selenium, mercury iodide, lead oxide, microcrystalline silicon, nanocrystalline silicon, single crystal silicon, 3,4,9,10-perylenetetracarboxylic bisbenzimidazole (PTCBI), silicon nanowires, and copper phthalocyanine (CuPc).

The second electrode 112 is located on a side of the light detection layer 213 away from the base substrate 11. For example, the second electrode 112 is a transparent electrode to increase the light transmittance, thereby improving the detection sensitivity of the photosensitive element. For example, the second electrode 112 is a transparent metal oxide electrode, such as indium tin oxide (ITO), indium zinc oxide (IZO), aluminum zinc oxide (AZO) or the like. For example, the first electrode 111 is formed of a metal material having high conductivity and reflectance, such as molybdenum, copper, magnesium, aluminum, or an alloy thereof.

The switching transistor 104 includes a gate electrode 141, a gate insulating layer 142, an active layer 143, a source electrode 144 and a drain electrode 145. The first electrode 111 of the photosensitive element 106 is electrically connected with the drain electrode 145 of the switching transistor 104. As shown in the figures, the first electrode 111 of the photosensitive element 106 is electrically connected with the drain electrode 145 of the switching transistor 104 through direct contact by overlapping without via holes. In another example, the first electrode 111 of the photosensitive element 106 may be electrically connected with the drain electrode 145 of the switching transistor 104 through a via hole in an intermediate insulating layer. In still another embodiment, the first electrode 111 of the photosensitive element 106 and the drain electrode 145 of the switching transistor 104 together form a one-piece structure, that is, an extension of the drain electrode 145 of the switching transistor 104 serves as the first electrode 111 of the photosensitive element 106. The embodiments of the present disclosure do not limit the manner of connection between the switching transistor 104 and the photosensitive element 106.

The embodiments of the present disclosure do not limit the type, material and structure of the switching transistor 104. For example, in the situation where the switching transistor 104 adopts a thin film transistor, it may be a top gate type or a bottom gate type thin film transistor, or the like; the active layer of the switching transistor 104 may be amorphous silicon, polycrystalline silicon (low temperature polycrystalline silicon or high temperature polycrystalline silicon), oxide semiconductor (for example, IGZO), or the like; and the switching transistor 104 may be N-type or P-type. The switching transistor 104 can be other suitable types of switching devices such as a field effect transistor.

For example, the material of the gate electrode 141, the source electrode 144 and the drain electrode 145 of the switching transistor 104 may include aluminum, aluminum alloy, copper, copper alloy or any other suitable material, which is not limited by the embodiments of the present disclosure.

For example, the material of the gate insulating layer 142 may include an inorganic insulating material such as SiNx, SiOx, SiNxOy, an organic insulating material such as an organic resin, or other suitable materials, which is not limited by the embodiments of the present disclosure.

It should also be noted that because the source electrode 144 and the drain electrode 145 of the switching transistor 104 are physically symmetrical, the two are interchangeable according to the actual circuit connections.

The reflective grating 101 is disposed on a side of the drive circuit 110 where the first light beam 122 is incident, and is configured to reflect at least a portion of the first light beam 122 incident toward the switching transistor 104. For example, the reflective grating 101 at least partially covers the switching transistor 104. For example, an orthographic projection of the reflective grating 101 on the base substrate 11 covers an orthographic projection of the channel region in the active layer 143 (i.e. a portion of the active layer 143 between the source electrode 144 and the drain electrode 145) of the switching transistor 104 on the base substrate 11. The reflective grating 101 can prevent light from being incident on the active layer 143 of the switching transistor 104 and affecting the properties of the semiconductor layer and prevent the generation of leakage current. The reflective grating has a better light-shielding effect than the conventional metal light-shielding layer, so that the switching transistor 104 can have a more stable performance, thereby improving the accuracy and sensitivity of the detection panel 100.

Figure 3A:
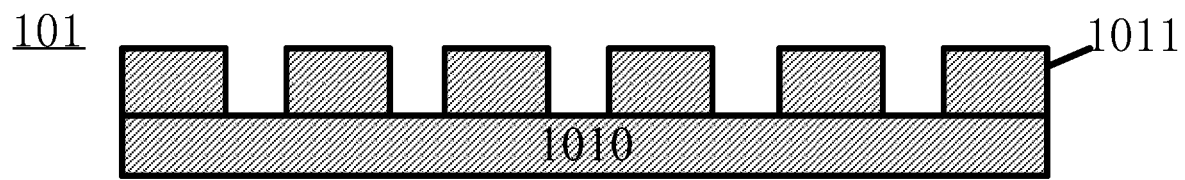
FIG. 3A-3B are schematic cross-sectional views showing a reflective grating according to embodiments of the present disclosure.
Figure 3B:
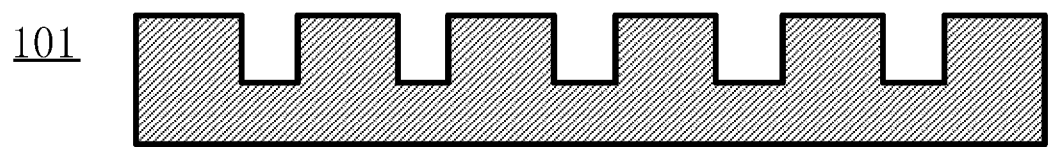

A grating is a periodic optical structure formed by a plurality of slits. By designing the structural parameters of the grating, such as the period, depth and duty ratio, and by selecting the material of the grating, the grating can have a reflective function or a transmissive function (anti-reflective function). For example, a bandwidth of the grating may be designed based on a wavelength range of the first light beam 122 or taking the wavelength of the first light beam 122 as a central reflection wavelength of the grating. As shown in FIG. 2, the reflective grating 101 includes grating ridges 1011. For example, in one example, the reflective grating 101 includes a base 1010 and the grating ridges 1011 (shown in FIG. 3A) formed on the base 1010, or includes a one-piece structure formed by the grating ridges and the base, that is, a surface relief structure in the grating material layer (as shown in FIG. 3B). A cross-sectional shape of the grating ridge 1011 may include a rectangle, a triangle, a step, a trapezoid or the like, which is not limited in the embodiments of the present disclosure.

For example, a material of the reflective grating 101 is a metal such as aluminum, copper, gold, silver, molybdenum or an alloy thereof.

In one example, the reflective grating 101 includes a sub-wavelength reflective grating, and the sub-wavelength grating refers to a grating having a grating period which is less than a wavelength of the incident light. In the situation where the incident light is projected onto the sub-wavelength grating, higher order diffracted waves in the diffraction order of the grating disappear, leaving only zero order diffracted waves. The grating can have a reflective function or a transmissive function (anti-reflective function) by changing the structural parameters of the grating, such as period, depth, and duty ratio.

For example, the structural parameters of the grating may be designed according to the Regious Coupled Wave Analysis (RCWA) and the Finite Difference Time Domain (FDTD) to obtain a reflective grating or a transmission grating (anti-reflective grating). For example, Rsoft software may be used to simulate, design and optimize the parameters and the structure of the grating. For example, the sub-wavelength reflective grating has a period ranging from 0.1 μm to 0.5 μm and a duty ratio ranging from 0.6 to 0.8.

In at least one embodiment of the present disclosure, for example, the reflective grating 101 is a high contrast sub-wavelength grating (HCGs), and such a grating includes grating ridge structures with a high refractive index (e.g. a metal) surrounded by a low refractive index material such as air or an oxide. By increasing a refractive index difference between the grating ridges and the low refractive index material, the reflective grating can have a larger reflection bandwidth. For example, as shown in FIG. 3A, the reflective grating 101 includes a base 1010 and grating ridges 1011 formed on the base 1010, and the base 1010 has a refractive index lower than that of the grating ridges 1011. For example, in the reflective grating 101, the material of the base 1010 is indium phosphide (InP), and the material of the grating ridge 1011 is indium gallium arsenide phosphide (InGaAsP). For example, the grating ridges 1011 have a period of 0.5 μm and a duty ratio of 0.7.

For example, in FIG. 2, by selecting a suitable material, the insulating layer 108 may serve as the base of the grating to form the high contrast sub-wavelength grating together with the grating ridges 1011. For example, the material of the insulating layer 108 is a nitride of silicon, an oxide of silicon or an oxynitride of silicon, and the material of the grating ridge 1011 is a metal. For example, as shown in FIG. 2, the detection panel 100 further includes a protective layer 107, and the protective layer 107 fills the recesses between the grating ridges 1011 and surrounds the grating ridges. The protective layer 107 may have a refractive index lower than that of the grating ridges 1011 by selecting a suitable material, thereby allowing the protective layer 107, the grating ridges 1011 and the insulating layer 108 to form a high contrast sub-wavelength grating. For example, the material of the protective layer 107 is an oxide of silicon, a nitride of silicon or an oxynitride of silicon.

For example, in at least one example, the detection panel 100 may further include a transmission grating 102 disposed on the side of the photosensitive element 106 where the first light beam 122 is incident, that is, the transmission grating 102 is between the photosensitive element 106 and the light conversion layer 109, and the transmission grating 102 is configured to transmit at least a portion of the first light beam 122 incident from the light conversion layer toward the photosensitive element 106. For example, an orthographic projection of the transmission grating 102 on the base substrate 11 covers the orthographic projection of the photosensitive element 106 on the base substrate 11. By providing the transmission grating, the light transmittance can be increased, which allows the light intensity received by the photosensitive element 106 to be higher to improve the photosensitive efficiency of the photosensitive element 106. For example, in the case where the detection panel 100 is applied to an X-ray detector, the transmission grating not only allows the detection panel 100 to have a higher sensitivity, but also reduces the radiation dose of the second light beam 121 (X-ray), thereby reducing the damage to the environment, the human body, etc.

For example, the material of the transmission grating 102 is a metal material such as aluminum, copper, gold, silver, molybdenum or alloys thereof.

For example, the transmission grating 102 is a sub-wavelength anti-reflective grating. For example, the sub-wavelength anti-reflective grating has a thickness ranging from 80 nm to 150 nm, a duty ratio ranging from 0.15 to 0.5, and a period ranging from 0 to 300 nm. For example, the sub-wavelength anti-reflective grating has a material of gallium arsenide (GaAs), a period of 200 nm, a thickness of 100 nm, and a duty ratio of 0.5.

For example, as shown in FIG. 2, the detection panel 100 further includes a bias voltage line 105 which is electrically connected with the photosensitive element 106 to provide a bias voltage signal. For example, the bias voltage line 105 is electrically connected with the second electrode 112 of the photosensitive element 106 through a first via hole 180 in the insulating layer 108.

For example, a material of the bias voltage line 105 is a conductive metal material such as molybdenum, copper, magnesium, aluminum or any alloy material thereof. For example, the material of the bias voltage line 105 may be a transparent metal oxide conductive material such as indium tin oxide (ITO), indium zinc oxide (IZO), aluminum zinc oxide (AZO), or the like.

For example, in at least one example, the transmission grating 102 and the reflective grating 101 are disposed in a same layer, in which case the transmission grating 102 and the reflective grating 101 may be formed in a same layer by a same patterning process. For example, the transmission grating 102 and the reflective grating 101 are of a same material, such as a metal material. By designing the structural parameters of the transmission grating 102 and the reflective grating 101 respectively, the transmission grating 102 and the reflective grating 101 respectively have a transmissive function and a reflective function for a same incident light beam (for example, the first light beam 122) having a same wavelength (or wavelength range).

For example, in at least one example, the bias voltage line 105, the transmission grating 102 and the reflective grating 101 are in a same layer, in which case the bias voltage line 105, the transmission grating 102 and the reflective grating 101 may be formed in a same layer by a same patterning process. For example, the material of the transmission grating 102, the material of the reflective grating 101 and the material of the bias voltage line 105 are same, and are a same conductive material, such as a metal material.

It should be noted that "in a same layer" in the present disclosure means that plural structures are formed by a same material through a same patterning process or different patterning processes, so that the plural structures are formed in a same layer structure with respect to the base substrate; the plural structures located "in a same layer" may have a same height with respect to a same plane, or may have different heights with respect to a same plane; the plural structures located "in a same layer" may have a same thickness, or may have different thicknesses, which are not limited in the embodiments of the present disclosure.

Figure 4:
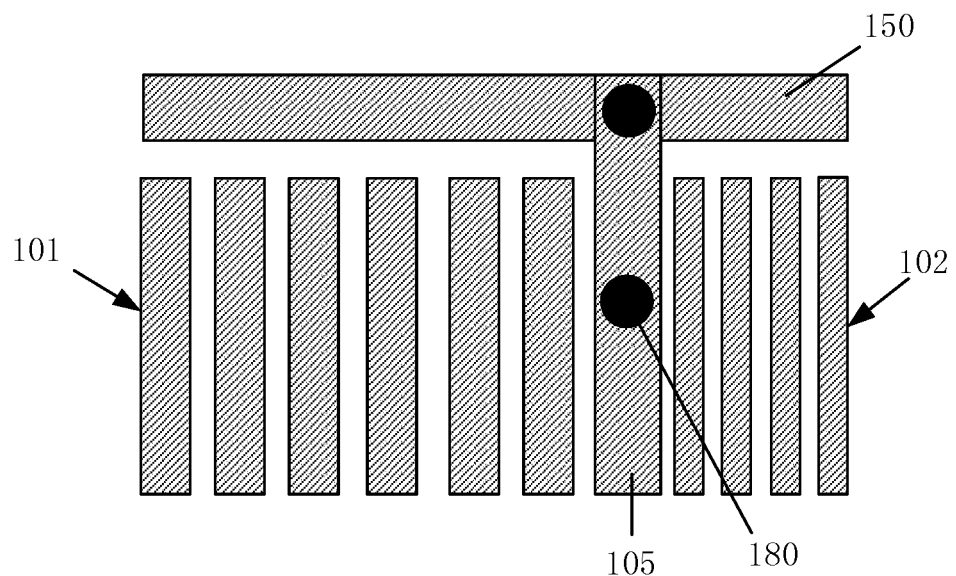
FIG. 4 is a partial plan view of a pixel unit of the detection panel according to an embodiment of the present disclosure.

FIG. 4 is a partial plan view of one pixel unit of the detection panel according to an embodiment of the present disclosure. The figure shows a case where the bias voltage line 105, the transmission grating 102 and the reflective grating 101 are disposed in a same layer. As shown in the figure, the detection panel may further include a conductive wire 150, and the conductive wire 150 is electrically connected with the bias voltage line 105 and connects the bias voltage line 105 to an external circuit (not shown) which provides a bias voltage signal for the bias voltage line. For example, the external circuit is an IC circuit, and is electrically connected with the conductive wire 150 through, for example, a flexible printed circuit (FPC). For example, the transmission grating 102 and the reflective grating 101 are one-dimensional gratings. In another example, the transmission grating 102 and/or the reflective grating 101 may be two-dimensional gratings, which is not limited in the embodiments of the present disclosure.

For example, the source electrode 143 of the switching transistor 104 is electrically connected with a processing circuit through a detection line, the processing circuit is, for example, the above mentioned signal amplifying and reading circuit 13, and the second electrode 112 of the photosensitive element 106 is configured to receive the bias voltage signal to form a photosensitive circuit.

Figure 5:
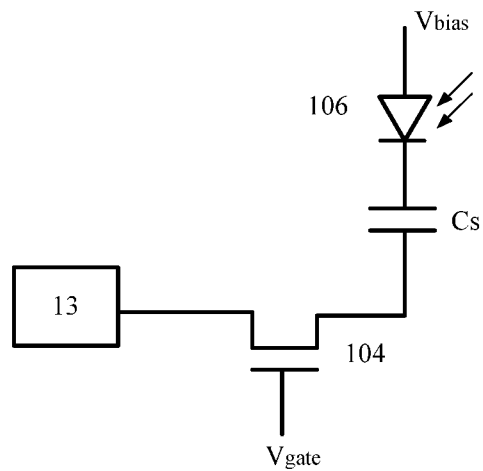
FIG. 5 is a schematic diagram of a photosensitive circuit of the detection panel according to an embodiment of the present disclosure.

In at least one embodiment of the present disclosure, the storage capacitance of the photosensitive circuit is provided by a reverse bias capacitor Cs of the photodiode of the photosensitive element 106, and FIG. 5 shows an equivalent circuit diagram of the photosensitive circuit of the detection panel in FIG. 2. A working process of the photosensitive circuit includes: in a reset period, the control signal Vgate is an on signal, the switching transistor 104 is turned on, and the signal amplifying and reading circuit 13 writes a reset signal to the capacitor Cs via the switching transistor 104 to reset the capacitor; in a photosensitive period, the control signal Vgate is an off signal, the switching transistor 104 is turned off, the photosensitive element 106 operates under the bias voltage signal Vbias provided by the bias voltage line to sense the first light beam and to generate the photosensitive signal, and the photosensitive signal is stored in the capacitor Cs; in a reading period, Vgate is an on signal, the switching transistor 104 is turned on, and the signal amplifying and reading circuit 13 reads the photosensitive signal stored in the capacitor Cs via the switching transistor 104, the signal amplifying and reading circuit further perform amplification, analog/digital conversion, etc. on the photosensitive signal to obtain a digital signal, and the digital signal is transmitted to an image processor system (for example, a CPU or a GPU or the like) of a computer to form an image.

The equivalent circuit diagram of the photosensitive circuit shown in FIG. 5 is only an example. For example, the photosensitive circuit may further include a reset circuit, an amplifying circuit, and the like. For example, the storage capacitor may have other connection manners, and embodiments of the present disclosure are not limited to the illustrated specific circuits.

For example, the detection panel further includes the gate drive circuit, and the gate drive circuit is electrically connected with the drive circuit 110 of the pixel unit and is configured to provide a scan signal to control the drive circuit 110. For example, in the above reading period, the gate drive circuit supplies a control signal Vgate to the pixel units row by row to turn on the switching transistors of the pixel units row by row. For example, the gate drive circuit may be implemented as an integrated circuit chip or a GOA (gate on array) type gate drive circuit. For example, the integrated circuit chip is electrically connected with the gate lines by bonding; and the GOA type gate drive circuit may include a plurality of cascaded shift register units, and the shift register unit may have, for example, 4T1C or other conventional structures in the field, which are not repeated here.

For example, the base substrate 11 may be formed of, for example, glass, plastic, quartz, or other suitable materials, which is not limited by the embodiments of the present disclosure.

The positional relationship between the drive circuit 110 and the photosensitive element 106 in the detection panel is not limited in the embodiments of the present disclosure. For the structure having different positional relationships between the drive circuit 110 and the photosensitive element 106, the positions of the reflective grating 101 and the transmission grating 102 are also changed accordingly.

Figure 6:
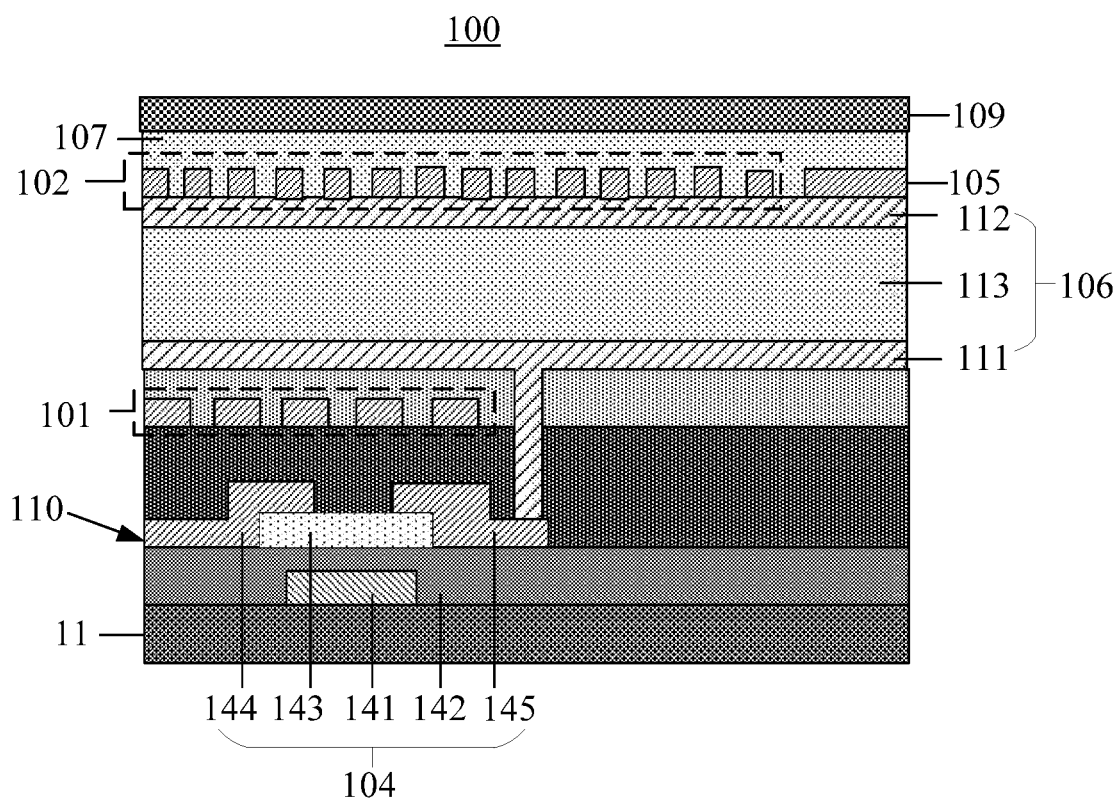
FIG. 6 is a schematic cross-sectional structural view of the detection panel according to another embodiment of the present disclosure.

FIG. 6 is a cross-sectional view showing the detection panel according to another embodiment of the present disclosure. The detection panel of this embodiment differs from the structure of the detection panel in the embodiment shown in FIG. 2 in that the photosensitive element 106 is closer to the light incident side of the detection panel where the first light beam is incident than the drive circuit 110. As shown in FIG. 6, the photosensitive element 106 is located on the side of the drive circuit 110 away from the base substrate 11, and at least partially overlaps the drive circuit 110 in a direction perpendicular to the base substrate 11. This arrangement can prevent the drive circuit 110 from occupying the photosensitive area, thereby increasing the photosensitive area of the photosensitive element 106. For example, the light detection layer 113 may be formed as an entire surface in one pixel unit, whereby the detection sensitivity and imaging quality of the detection panel can be improved. As shown in FIG. 6, the transmission grating 102 is disposed on the side of the photosensitive element 106 where the first light beam is incident, and is configured to increase the transmittance of the first light beam. The reflective grating 101 is disposed between the photosensitive element 106 and the drive circuit; that is, on a side of the photosensitive element 106 close to the drive circuit 110. The reflective grating 101 is configured to reflect the first light beam transmitted through the photosensitive element 106, thereby protecting the switching transistor 104 from the adverse effects of the first light beam. As shown in FIG. 6, the transmission grating 102 and the bias voltage line 105 are formed directly on the second electrode 112. For example, a material of the transmission grating 102 is a conductive material, the transmission grating 102 and the bias voltage line 105 are formed in a same layer by a same patterning process, and the bias voltage line 105 is electrically connected with the second electrode 112 through direct contact by overlapping without via holes. For example, the transmission grating 102 and the bias voltage line 105 may also be formed on the second electrode 112 and be separated from the second electrode by an insulating layer.

At least one embodiment of the present disclosure further provides a manufacturing method of the detection panel. For example, the manufacturing method can be used to form the detection panel provided by any embodiment of the present disclosure. The manufacturing method of the detection panel includes at least steps S71 to S73.

Step S71: forming a photosensitive element which is configured to sense an incident first light beam to generate a photosensitive signal.

Step S72: forming a drive circuit, which includes forming a switch element. The drive circuit is configured to be coupled to the photosensitive element to acquire the photosensitive signal from the photosensitive element.

Step S73: forming a reflective grating. The reflective grating is located on the side of the drive circuit where the first light beam is incident, and is configured to reflect at least a portion of the first light beam incident toward the switch element.

Figure 7:
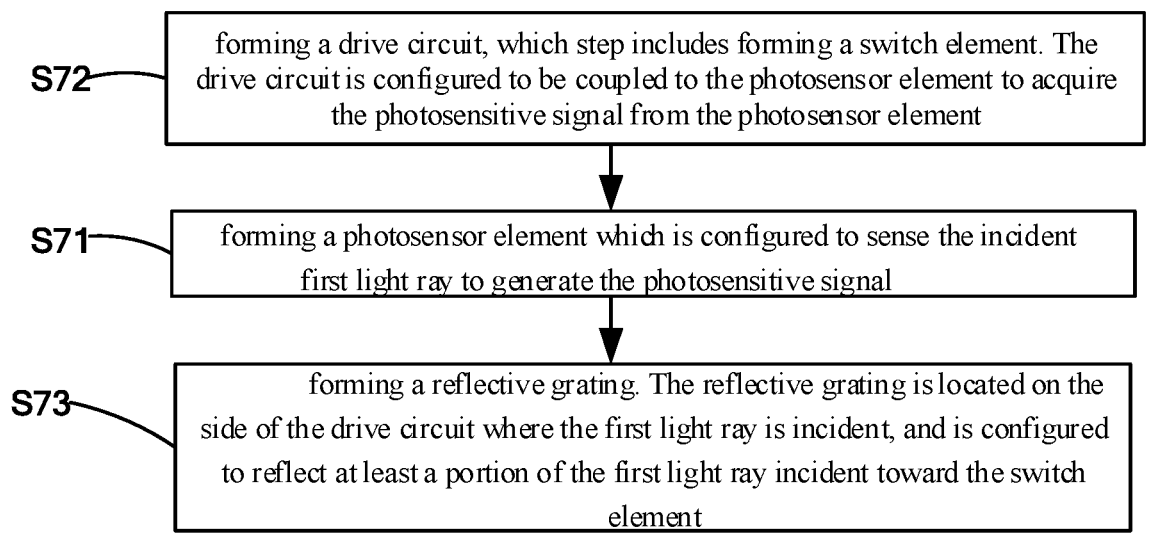
FIG. 7 is a flowchart of a manufacturing method of a detection panel according to an embodiment of the present disclosure.

The embodiments of the present disclosure do not limit the order of implementation of the above steps. FIG. 7 is a flowchart of the manufacturing method of the detection panel according to an embodiment of the present disclosure. The manufacturing method of the detection panel provided by an embodiment of the present disclosure is exemplified in the following, taking the sequence of step S72, step S71 to step S73 as an example and with reference to FIG. 2 and FIG. 7.

In an example of step S72, the base substrate 11 is firstly provided, and then the drive circuit 110 is formed on the base substrate 11 by, for example, a semiconductor process. For example, as shown in FIG. 2, forming the drive circuit 110 includes forming a switching transistor 104, and the method for forming the switching transistor 104 includes, for example, forming a gate electrode 141, a gate insulating layer 142, an active layer 143, a source electrode 144 and a drain electrode 145 on the base substrate 11; in at least one example, gate lines and data lines are also formed in this process, the gate line is electrically connected, for example, with the gate electrode 141, and the data line is electrically connected, for example, with the source electrode 144; in at least one example, a conductive wire (e.g., the foregoing conductive wire 150) connected with a bias voltage line formed later is formed. For example, a physical vapor deposition process (for example, for forming a conductive layer), a chemical vapor deposition process (for example, for forming an insulating layer), a spin coating process (for example, for forming an organic layer), and a photolithography process (for example, a patterning process) and the like may be employed in the formation process.

In one example of step S71, as shown in FIG. 2, a first electrode 111, a light detection layer 113 and a second electrode 112 are sequentially formed to form the photosensitive element 106. For example, the first electrode 111 is directly formed on the drain electrode 145 of the switching transistor 104 to form electrical connection by overlapping without via holes; that is, no interlayer is formed between the first electrode 111 and the drain electrode 145. In another example, the drain electrode 145 of the switching transistor 104 may directly serve as the first electrode of the photosensitive element, that is, the detection layer 113 is directly formed on the drain electrode 145 of the switching transistor 104.

For example, the first electrode 211 is a transparent electrode to increase the light transmittance. For example, the first electrode 211 is a transparent metal oxide electrode such as indium tin oxide (ITO), aluminum zinc oxide (AZO), or the like. For example, the second electrode 212 is formed of a metal material to increase electricity conductivity, such as molybdenum, copper, magnesium, or any alloy material thereof.

For example, the photosensitive element 106 is implemented as a photodiode. For example, forming the light detection layer includes: sequentially depositing an n-type semiconductor layer and a p-type semiconductor layer on the first electrode 111 to form a PN structure, or sequentially depositing an n-type semiconductor layer, an intrinsic semiconductor layer and a p-type semiconductor layer on the first electrode 111 to form a PIN structure.

For example, step S71 further includes forming the insulating layer 108 on the photosensitive element 106; for example, the insulating layer is a planarization layer, and the material of the insulating layer is, for example, an oxide of silicon, a nitride of silicon or an oxynitride of silicon.

In an example of step S73, as shown in FIG. 2, the reflective grating 101 is formed on the insulating layer 108. For example, firstly, structural parameters (e.g., period, depth and duty ratio) of a grating structure having a reflective function are obtained according to the regious coupled wave analysis (RCWA) and the finite difference time domain method (FDTD). For example, Rsoft software may be used to simulate, design and optimize the structure and parameters of the grating. For example, a reflection bandwidth of the reflective grating may be designed centered on the wavelength or wavelength range of a designated incident light beam. For example, the incident light beam is visible light having a wavelength in the range of 350 nm to 770 nm. For example, the wavelength of the visible light is around 550 nm. For example, a grating material layer is formed on the insulating layer 108, and then the grating material layer is etched according to the parameters obtained above to obtain the grating structure having a reflective function.

For example, the material of the grating material layer is a metal material; for example, the metal material is formed by sputtering. For example, the metal material is aluminum, copper, gold, silver, molybdenum or an alloy thereof.

For example, the grating material layer is etched by using an induction coupled plasma (ICP) dry etching process. This etching process has good directivity and allows the grating structure to have a higher precision.

In one example, the reflective grating 101 is formed as a sub-wavelength grating, such as the high contrast sub-wavelength grating. As shown in FIG. 3A, forming the reflective grating includes forming the base 1010 having a low refractive index and the grating ridges 1011 having a high refractive index. For example, the material of the base 1010 is indium phosphide (InP), and the material of the grating ridges 1011 is indium gallium arsenide phosphide (InGaAsP). For example, the grating ridges 1011 have a period of 0.5 μm and a duty ratio of 0.7.

For example, one method for forming the reflective grating 101 includes: epitaxially growing an InP material layer on an InP base, and then epitaxially forming an InGaAsP material layer on the InP material layer, for example, the epitaxial process being a metal organic vapor deposition (MOCVD) process; subsequently, etching the InGaAsP material layer to form the grating structure; then, transferring the grating structure to the insulating layer 108 to form the reflective grating 101.

For example, step S73 further includes forming the protective layer 107, which is a transparent material such as a nitride of silicon, an oxide of silicon or an oxynitride of silicon.

For example, the manufacturing method further includes providing a light conversion layer 109 configured to convert an incident second light beam 121 having a second wavelength into the first light beam 122 having the first wavelength, and the second wavelength is less than the first wavelength. For example, providing the light conversion layer includes forming the light conversion layer on the light incident side of the detection panel. For example, the second light beam 121 is an X-ray and the first light beam 122 is the visible light. For example, the visible light has a wavelength in the range of 350 nm to 770 nm. For example, the wavelength of the visible light is around 550 nm. For example, the material of the light conversion layer is a scintillator (cesium iodide) or a phosphor (gadolinium oxysulfide).

For example, the light conversion layer is formed on the protective layer 107 by a deposition process or the like, or the light conversion layer is separately formed and then is attached to the protective layer 107 by an adhesive.

For example, the manufacturing method also includes forming a transmission grating 102. The transmission grating is formed on the side of the photosensitive element 106 where the first light beam is incident, and is configured to transmit the first light beam. For example, the transmission grating can be formed in conjunction with the parameters so as to have a transmissive function and with reference to the manufacturing method of the reflective grating 101 described above. For example, the transmission grating is a sub-wavelength anti-reflective grating.

In one example, the reflective grating 101 and the transmission grating 102 may be formed in a same layer in a same patterning process.

For example, the manufacturing method further includes forming the a voltage line 105 and via holes for the bias voltage line 105, and the bias voltage line 105 is electrically connected with the corresponding conductive wire (for example, the aforementioned conductive wire 150) and the photosensitive element 106 through the via holes, respectively, to provide the bias voltage signal to the photosensitive element 106.

In one example, the bias voltage line 105, the transmission grating 102 and the reflective grating 101 may be formed in a same layer in a same patterning process. For example, as shown in FIG. 2, a conductive material layer is formed on the insulating layer 108 and the conductive material layer is patterned to form the bias voltage line 105, the transmission grating 102 and the reflective grating 101. For example, the conductive material layer is formed of a metal material such as molybdenum, copper, magnesium, aluminum or any alloy material thereof.

What are described above is related to the illustrative embodiments of the disclosure only and not limitative to the scope of the disclosure; the scopes of the disclosure are defined by the accompanying claims.

What is claimed is:
1. A detection panel, comprising:
   a photosensitive element, configured to sense a first light beam incident to the photosensitive element to generate a photosensitive signal;
   a drive circuit, configured to be coupled to the photosensitive element to acquire the photosensitive signal from the photosensitive element, wherein the drive circuit comprises a switch element;
   a reflective grating, which is on a side of the drive circuit where the first light beam is incident, and is configured to reflect at least a portion of the first light beam incident toward the switch element; and
   a light conversion layer,
   wherein the first light beam has a first wavelength, and the light conversion layer is configured to convert a second light beam which is incident on the light conversion layer into the first light beam, and the second light beam has a second wavelength smaller than the first wavelength.

2. The detection panel of claim 1, wherein the switch element comprises a thin film transistor.

3. The detection panel of claim 2, further comprising a base substrate, wherein the photosensitive element, the drive circuit and the reflective grating are on the base substrate;
an orthographic projection of the reflective grating on the base substrate covers an orthographic projection of a channel region of the thin film transistor on the base substrate.

4. The detection panel of claim 1, wherein a material of the reflective grating is a metal material.

5. The detection panel of claim 1, further comprising a transmission grating, wherein the transmission grating is on a side of the photosensitive element where the first light beam is incident and is configured to transmit at least a portion of the first light beam incident toward the photosensitive element.

6. The detection panel of claim 5, further comprising a base substrate, wherein the photosensitive element, the drive circuit, the reflective grating and the transmission grating are on the base substrate, and an orthographic projection of the transmission grating on the base substrate covers an orthographic projection of the photosensitive element on the base substrate.

7. The detection panel of claim 5, further comprising a bias voltage line, wherein the bias voltage line is electrically connected with the photosensitive element to provide a bias voltage signal; the bias voltage line, the reflective grating and the transmission grating are in a same layer and are made of a same material.

8. The detection panel of claim 5, wherein the transmission grating comprises a sub-wavelength anti-reflective grating.

9. The detection panel of claim 8, wherein the sub-wavelength anti-reflective grating has a thickness ranging from 80 nm to 150 nm.

10. The detection panel of claim 8, wherein the sub-wavelength anti-reflective grating has a duty ratio ranging from 0.15 to 0.5.

11. The detection panel of claim 1, wherein the reflective grating is on a side of the photosensitive element close to the drive circuit.

12. The detection panel of claim 1, wherein the reflective grating comprises a sub-wavelength reflective grating.

13. The detection panel of claim 12, wherein the sub-wavelength reflective grating comprises a base and grating ridges on the base, and the base has a refractive index lower than a refractive index of the grating ridges.

14. The detection panel of claim 13, wherein a material of the base is indium phosphide (InP) and a material of the grating ridges is indium gallium arsenide phosphide (In-GaAsP).

15. The detection panel of claim 12, wherein the sub-wavelength reflective grating has a period ranging from 0.1 µm to 0.5 µm and has a duty ratio ranging from 0.6 to 0.8.

16. A detection panel, comprising:
a photosensitive element, configured to sense a first light beam incident to the photosensitive element to generate a photosensitive signal;
a drive circuit, configured to be coupled to the photosensitive element to acquire the photosensitive signal from the photosensitive element, wherein the drive circuit comprises a switch element;
a reflective grating, which is on a side of the drive circuit where the first light beam is incident, and is configured to reflect at least a portion of the first light beam incident toward the switch element; and
a transmission grating, which is on a side of the photosensitive element where the first light beam is incident and is configured to transmit at least a portion of the first light beam incident toward the photosensitive element,
wherein the reflective grating and the transmission grating are in a same layer and are made of a same material.

17. A manufacturing method of a detection panel, comprising:
forming a photosensitive element, wherein the photosensitive element is configured to sense a first light beam incident to the photosensitive element to generate a photosensitive signal;
forming a drive circuit, comprising forming a switch element, wherein the drive circuit is configured to be coupled to the photosensitive element to acquire the photosensitive signal from the photosensitive element;
forming a reflective grating, wherein the reflective grating is on a side of the drive circuit where the first light beam is incident, and is configured to reflect at least a portion of the first light beam incident toward the switch element; and
forming a light conversion layer, wherein the first light beam has a first wavelength, and the light conversion layer is configured to convert a second light beam which is incident on the light conversion layer into the first light beam, and the second light beam has a second wavelength smaller than the first wavelength.

18. The manufacturing method of claim 17, further comprising forming a transmission grating on a side of the photosensitive element where the first light beam is incident,
wherein the transmission grating is configured to transmit at least a portion of the first light beam incident toward the photosensitive element, and the reflective grating and the transmission grating are formed in a same layer in a same patterning process.

19. The manufacturing method of claim 18, further comprising forming a bias voltage line electrically connected with the photosensitive element to provide a bias voltage signal,
wherein the reflective grating, the transmission grating and the bias voltage line are formed in the same layer in the same patterning process.

* * * * *